United States Patent
Zou

(10) Patent No.: US 10,616,690 B2
(45) Date of Patent: Apr. 7, 2020

(54) CAPACITIVE MEMS MICROPHONE AND ELECTRONIC APPARATUS

(71) Applicant: GOERTEK INC., Weifang, Shandong (CN)

(72) Inventor: Quanbo Zou, Weifang (CN)

(73) Assignee: GOERTEK INC., Weifang, Shandong (CN)

( * ) Notice: Subject to any disclaimer, the term of this patent is extended or adjusted under 35 U.S.C. 154(b) by 0 days.

(21) Appl. No.: 16/077,638

(22) PCT Filed: Aug. 22, 2016

(86) PCT No.: PCT/CN2016/096198
§ 371 (c)(1),
(2) Date: Aug. 13, 2018

(87) PCT Pub. No.: WO2018/035669
PCT Pub. Date: Mar. 1, 2018

(65) Prior Publication Data
US 2019/0058956 A1    Feb. 21, 2019

(51) Int. Cl.
| | | |
|---|---|---|
| *H04R 19/04* | (2006.01) | |
| *H04R 19/00* | (2006.01) | |
| *H04R 1/28* | (2006.01) | |
| *B81B 7/02* | (2006.01) | |

(52) U.S. Cl.
CPC ............ *H04R 19/005* (2013.01); *B81B 7/02* (2013.01); *H04R 1/2876* (2013.01); *H04R 19/04* (2013.01); *B81B 2201/0257* (2013.01); *B81B 2203/0127* (2013.01); *B81B 2203/0315* (2013.01); *B81B 2203/04* (2013.01)

(58) Field of Classification Search
CPC .... H04R 19/005; H04R 19/016; H04R 19/04; H04R 2201/003; G01L 9/0072; G01L 9/0073
See application file for complete search history.

(56) References Cited

U.S. PATENT DOCUMENTS

| | | | | |
|---|---|---|---|---|
| 4,885,783 A * | 12/1989 | Whitehead | ............ | B06B 1/0292 |
| | | | | 381/191 |
| 5,146,435 A * | 9/1992 | Bernstein | ............... | G01H 11/06 |
| | | | | 29/25.42 |
| 5,452,268 A * | 9/1995 | Bernstein | ............ | H04R 19/005 |
| | | | | 367/181 |

(Continued)

FOREIGN PATENT DOCUMENTS

| | | |
|---|---|---|
| CN | 101150889 A | 3/2008 |
| CN | 101242682 A | 8/2008 |

(Continued)

*Primary Examiner* — Fan S Tsang
*Assistant Examiner* — Ryan Robinson
(74) *Attorney, Agent, or Firm* — Saliwanchik, Lloyd & Eisenschenk

(57) ABSTRACT

The present invention discloses a capacitive MEMS microphone and an electronic apparatus. The capacitive MEMS microphone comprises: a diaphragm; and a substrate, wherein a cavity is formed between the diaphragm and the substrate, and the cavity is filed with an elastic body. According to an embodiment of this invention, an elastic body is adopted in a capacitive MEMS microphone to replace the air gap of the prior art such that the SNR of the microphone is increased.

8 Claims, 2 Drawing Sheets

(56) References Cited

U.S. PATENT DOCUMENTS

| | | | |
|---|---|---|---|
| 5,573,679 A | 11/1996 | Mitchell et al. | |
| 6,688,179 B2* | 2/2004 | Potter | B81C 1/00158 257/248 |
| 6,865,140 B2* | 3/2005 | Thomenius | B06B 1/0292 367/155 |
| 6,873,863 B2* | 3/2005 | Hiltunen | G06F 3/03547 455/350 |
| 7,284,442 B2* | 10/2007 | Fleischman | A61B 5/0031 600/345 |
| 7,589,439 B2* | 9/2009 | Raisanen | H04R 19/016 307/400 |
| 7,670,290 B2* | 3/2010 | Hossack | B06B 1/0292 310/309 |
| 7,980,145 B2* | 7/2011 | Harish | G01L 1/142 324/660 |
| 8,063,458 B2* | 11/2011 | Loeffler | B81B 3/0072 257/419 |
| 8,742,517 B2* | 6/2014 | Langereis | B06B 1/0292 257/415 |
| 9,516,428 B2* | 12/2016 | Dehe | B81B 3/0018 |
| 9,641,949 B2* | 5/2017 | Massoner | B81C 1/00658 |
| 9,685,254 B2* | 6/2017 | Kokubo | H04R 19/00 |
| 9,947,858 B2* | 4/2018 | Fujisawa | C08K 3/22 |
| 10,017,379 B2* | 7/2018 | Rajaraman | G01N 27/223 |
| 10,284,963 B2* | 5/2019 | Koymen | B81C 1/00158 |
| 2005/0096546 A1* | 5/2005 | Hazard | B06B 1/0292 600/447 |
| 2007/0261894 A1* | 11/2007 | Harish | G01G 7/06 177/211 |
| 2011/0026367 A1* | 2/2011 | Noelle | B06B 1/02 367/189 |
| 2017/0245059 A1* | 8/2017 | Durand | H04R 19/005 |
| 2018/0136065 A1* | 5/2018 | Tan | H04R 19/04 |
| 2019/0112181 A1* | 4/2019 | Jaakkola | B81B 3/0078 |

FOREIGN PATENT DOCUMENTS

| | | |
|---|---|---|
| CN | 103152683 A | 6/2013 |
| CN | 203136098 U | 8/2013 |
| CN | 204408626 U | 6/2015 |
| JP | 2007267081 A | 10/2007 |

* cited by examiner

CAPACITIVE MEMS MICROPHONE AND ELECTRONIC APPARATUS

CROSS REFERENCE TO RELATED APPLICATIONS

This application is a National Stage of International Application No. PCT/CN2016/096198 filed on Aug. 22, 2016, which is hereby incorporated by reference in its entirety.

FIELD OF THE INVENTION

The present invention relates to the technical field of capacitive MEMS microphone, and in particular, to a capacitive MEMS microphone and an electronic apparatus.

BACKGROUND OF THE INVENTION

Microphones are transducers that convert acoustic energy into electronic energy. Many transduction principles have been developed, including the piezoelectric microphone, the capacitive microphone and the contact microphone.

In the prior art, the majority of silicon microphones are based on the capacitive detection principle. These microphones are also called as the capacitive microphone or condenser microphone.

A condenser microphone is disclosed in P. R. Scheeper, et al, A review of silicon microphone, Sensors and Actuators, A44, 1994, 1-11, which is hereby incorporated herein by reference. FIG. 1 shows the condenser microphone, which includes a diaphragm 11, an air gap 12, a back plate 13 and a back chamber 15. The back plate 13 has acoustic holes 14 connecting the air gap 12 and the back chamber 15.

The Micro-Electro-Mechanical Systems, or MEMS, refers to a miniaturized mechanical and electro-mechanical member (i.e., devices and structures) that is made using the techniques of micro-fabrication. A MEMS microphone is a microphone which is based on MEMS technology.

Therefore, there is a demand in the art that a new capacitive MEMS microphone shall be proposed to address at least one of the problems in the prior art.

SUMMARY OF THE INVENTION

One object of this invention is to provide a new technical solution for capacitive MEMS microphone.

According to a first aspect of the present invention, there is provided a capacitive MEMS microphone, comprising: a diaphragm; and a substrate, wherein a cavity is formed between the diaphragm and the substrate, and the cavity is filed with an elastic body.

Alternatively or optionally, a dielectric spacer is provided on the substrate, the diaphragm is provided on dielectric spacer, and the cavity is sealed by the diaphragm, the dielectric spacer and the substrate.

Alternatively or optionally, the elastic body is high electric breakdown gas sealed in the cavity, and the pressure inside the cavity is higher than an ambient pressure.

Alternatively or optionally, the elastic body is a solid elastic body.

Alternatively or optionally, the solid elastic body is at least one of elastomer and gel.

Alternatively or optionally, the solid elastic body is spaced by a gap from the side walls of the cavity.

Alternatively or optionally, the solid elastic body has an elastic modulus in a range of 1 kPa-5 MPa.

Alternatively or optionally, a top electrode is mounted on the diaphragm and a bottom electrode is mounted on the substrate.

Alternatively or optionally, the bias voltage for the capacitive MEMS microphone is 1-300V.

According to a second aspect of the present invention, there is provided an electronic apparatus, comprising a capacitive MEMS microphone according to the present invention.

According to an embodiment of this invention, an elastic body is adopted in a capacitive MEMS microphone to replace the air gap of the prior art such that the SNR of the microphone is increased.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
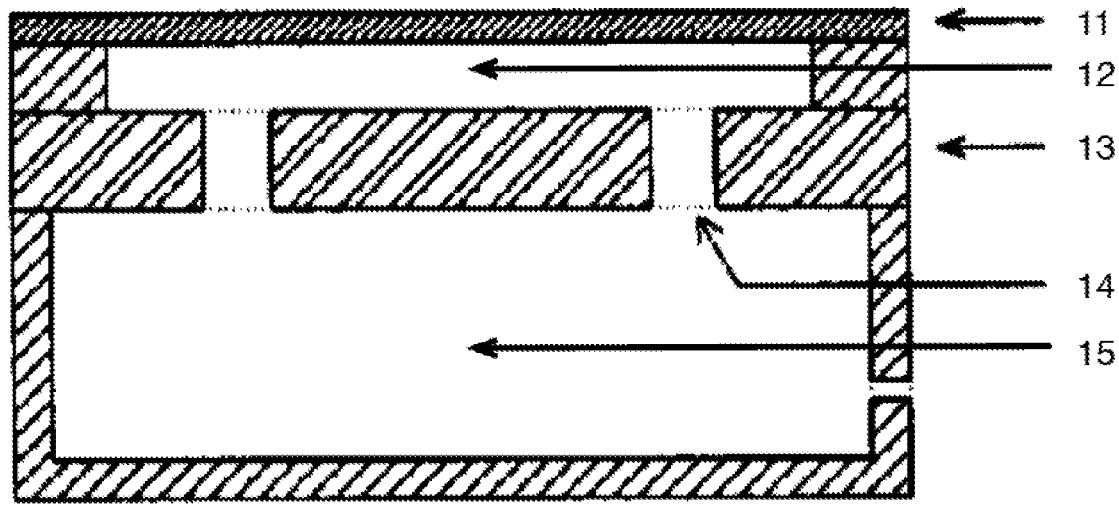
FIG. 1 is a schematic diagram of a condenser microphone of the prior art.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

With reference to FIG. 1, in a situation of a MEMS device, the air in the air gap 12 can be deemed to be incompressible. When the diaphragm 11 is vibrated, the air in the air gap 12 will flow into the back chamber 15 through the acoustic holes 14 in the back plate 13, which will cause a thermal noise. As result, the SNR of the microphone is limited.

Furthermore, in the microphone structure of FIG. 1, the allowable electric field between the diaphragm 11 and the back plate 13 is limited because the diaphragm 11 might be pulled into the back plate 13 under high electric field. As a result, the sensitivity of the microphone is limited. Otherwise, the air gap 12 shall be enlarged to accommodate the high electric field, which will increase the size of the microphone.

Besides, the air gap 12 and back chamber 15 are not sealed and thus they are sensitive to particle contamination.

Furthermore, because the diaphragm 11 is not supported in the air gap 12, it is relatively fragile.

In consideration of at least one of these factors, it is proposed in an embodiment of this invention that an elastic body (or gap) is used in place of the air gap. Embodiments and examples of this invention will be described with reference to FIGS. 2-4.

Figure 2:
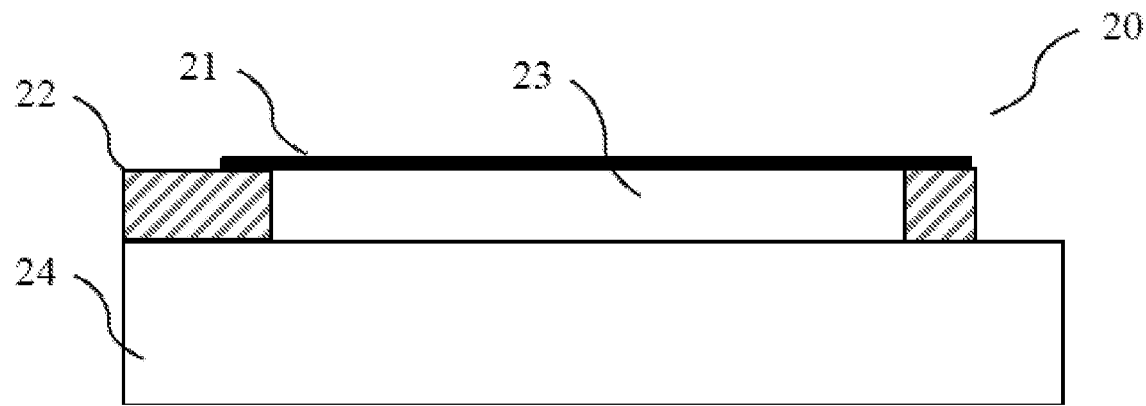
FIG. 2 is a schematic diagram of a capacitive MEMS microphone according to a first embodiment of the present invention.

FIG. 2 is a schematic diagram of a capacitive MEMS microphone according to a first embodiment of the present invention.

As shown in FIG. 2, a capacitive MEMS microphone 20 comprises a diaphragm 21 and a substrate 24. A cavity 23 is formed between the diaphragm 21 and the substrate 24. The cavity 23 is filed with an elastic body.

A person skilled in the art can conceive a lot of elastic bodies, which can be used in the cavity 23. In the example of FIG. 2, the cavity 23 is a sealed cavity. The elastic body can be high electric breakdown gas sealed in the cavity 23. In this situation, the sealed gas can be deemed to be an elastic gas.

Preferably, the pressure inside the cavity 23 is higher than an ambient pressure. By this approach, the pull-in of the diaphragm 21 can be prevented to some degree and thus a relatively high electric field can be applied between the diaphragm 21 and the substrate 24.

As shown in FIG. 2, a dielectric spacer 22 is provided on the substrate 24. The diaphragm 21 is provided on dielectric spacer 22. The cavity 23 is sealed by the diaphragm 21, the dielectric spacer 22 and the substrate 24.

For example, a top electrode (not shown) is mounted on the diaphragm 21 and a bottom electrode (not shown) is mounted on the substrate 24. An electric field is applied via the top and bottom electrodes for sensing the capacity changes between them. Preferably, the bias voltage for the capacitive MEMS microphone is 1-300V; more preferably 10-100V; and even more preferably 10-60V.

For example, the substrate 24 can be silicon, glass, ceramic, PCB, FPCB, etc. The dielectric spacer 22 can be $SiO_2$, $Si_xN_y$, polymer, resist, etc. The high electric breakdown gas can be SF6, C4F8, etc. In an example, the high electric breakdown gas can be gas of small molecular weight, such as He, Ar, etc. so that it is more easier for it to be compressed.

The materials of the diaphragm 21 can be silicon, polysilicon, metal/stack, alloy, polymer with metal, or any conductive thin film materials.

For example, the cavity 23 is sealed by hermetic. In this way, the microphone device can tolerate harsh environment such like humid, chemical or corrosive applications.

Figure 3:
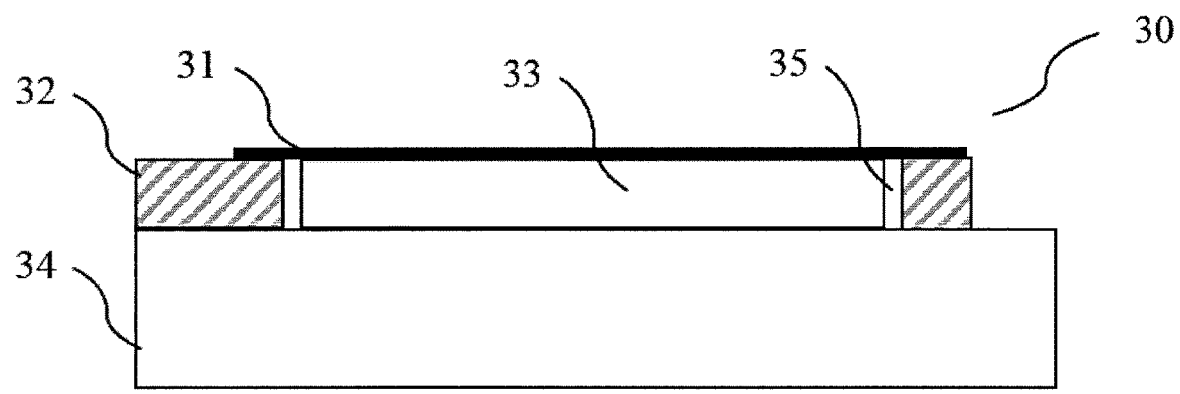
FIG. 3 is a schematic diagram of a capacitive MEMS microphone according to a second embodiment of the present invention.

FIG. 3 is a schematic diagram of a capacitive MEMS microphone according to a second embodiment of the present invention. The repetitive contents with the first embodiment will be omitted.

As shown in FIG. 3, a capacitive MEMS microphone 30 comprises a diaphragm 31 and a substrate 34. A cavity 33 is formed between the diaphragm 31 and the substrate 34. The cavity 33 is filed with an elastic body. In this embodiment, the elastic body is a solid elastic body such as at least one of elastomer and gel.

The diaphragm 31 can be supported on the solid elastic body to enhance the stability of the microphone.

In this embodiment, the solid state structure without freestanding/moving parts will lead to a high reliability of the microphone. The elastic material, such as elastomer or gel, provided or sealed inside the gap forms the major stiffness of the microphone, whilst the diaphragm 31 can be much more flexible against sound pressure.

In an example, the solid elastic body is spaced by a gap 35 from the side walls (such as the spacer 32) of the cavity 33. This structure can ensure an elastic mode displacement in the cavity 33 rather than a bulk mode compression, which will make the diaphragm 31 be more sensitive to the sound vibration.

Generally, the solid elastic body has an elastic modulus in a range of 1 kPa-5 MPa; and preferably 10 kPa-1 MPa. For example, a top electrode (not shown) is mounted on the diaphragm 31 and a bottom electrode (not shown) is mounted on the substrate 34. An electric field is applied via the top and bottom electrodes for sensing the capacity changes between them. Preferably, the bias voltage for the capacitive MEMS microphone is 1-300V; more preferably 10-100V; and even more preferably 10-60V.

In this embodiment, the cavity 33 can also be a sealed cavity. By this approach, it can be protected from particle contamination. As shown in FIG. 3, a dielectric spacer 32 is provided on the substrate 34. The diaphragm 31 is provided on dielectric spacer 32. The cavity 33 can be sealed by the diaphragm 31, the dielectric spacer 32 and the substrate 34.

For example, the substrate 34 can be silicon, glass, ceramic, PCB, FPCB, etc. The dielectric spacer can be $SiO_2$, $Si_xN_y$, polymer, resist, etc. The materials of the diaphragm can be silicon, polysilicon, metal/stack, alloy, polymer with metal, or any conductive thin film materials.

In the embodiments of the present invention, the top electrode in the diaphragm and the bottom electrode on substrate surface can form a sensing capacitance which is much higher than a typical MEMS microphone with an air gap because the dielectric constant thereof can be enhanced. Consequently, it produces a lower parasitic ratio and a higher SNR than the typical MEMS microphone.

In addition, the threshold of dielectric breakdown of the elastic body, such as sealed gas or solid elastic body, can be much higher than that of the air gap. Furthermore, the collapse or pull in of the diaphragm can be eliminated and a higher electric field than that of a typical MEMS microphone can be applied between the diaphragm and the substrate to increase the sensitivity and SNR of the capacitive MEMS microphone.

In addition, the relatively high dielectric constant in the cavity can also reduce sensing area and thus reduce the chip size, which will lead to a low cost.

This structure of capacitive MEMS microphone will not require a large back chamber as in the prior art. This will lead to a small size and a low cost in packaging.

The bulk resonance of the elastic body in cavity can produce a flat wideband frequency response.

Because the elastic body has a vertical elastic stiffness, the microphone will be insensitive to packaging stress, which will lead to a higher yield, a higher stability and a higher reliability in manufacturing.

By the embodiments of this invention, the fabrication of the diaphragm can be enriched, for example, by diaphragm bonding and dissolving, or by diaphragm deposition and patterning.

Figure 4:
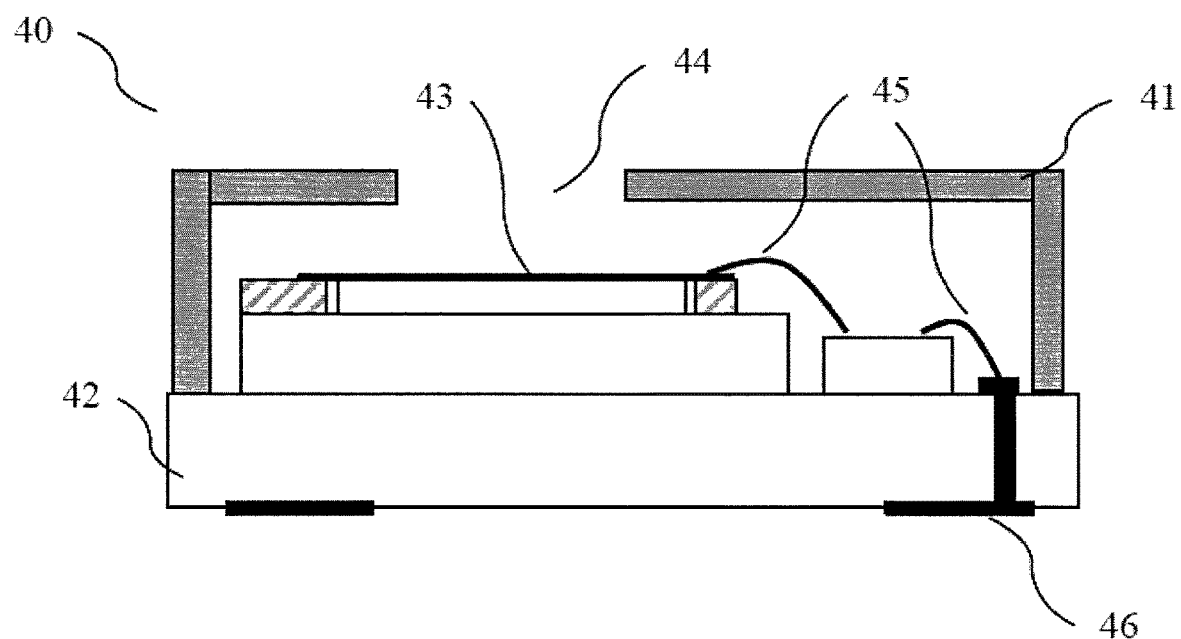
FIG. 4 is a schematic diagram of a circuit package containing a capacitive MEMS microphone according to an embodiment of the present invention.

FIG. 4 is a schematic diagram of a circuit package containing a capacitive MEMS microphone according to an embodiment of the present invention.

As shown in FIG. 4, the package 40 comprises a lid 41, a PCB 42 and a capacitive MEMS microphone 43. The lid 41 and the capacitive MEMS microphone 43 are mounted on the PCB 42. The lid 41 has an opening 44. Sound wave will travel through the opening 44 to the microphone 43. The microphone 43 is a capacitive MEMS microphone according to this invention. The microphone 43 is connected to the conductive lines 46 on the PCB 42 via the wires 45. The package 40 is a part of an electronic apparatus. The microphone 43 can be adopted in the electronic apparatus to detect sound waves.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A capacitive MEMS microphone, comprising:
   a diaphragm; and
   a substrate,
   wherein a cavity is formed between the diaphragm and the substrate, and the cavity is filled with a solid elastic body that is spaced by a gap from side walls of the cavity.

2. The capacitive MEMS microphone according to claim 1, wherein a dielectric spacer is provided on the substrate, the diaphragm is provided on dielectric spacer, and the cavity is sealed by the diaphragm, the dielectric spacer and the substrate.

3. The capacitive MEMS microphone according to claim 1, wherein the solid elastic body is at least one of elastomer and gel.

4. The capacitive MEMS microphone according to claim 1, wherein the solid elastic body has an elastic modulus in a range of 1 kPa-5 MPa.

5. The capacitive MEMS microphone according to claim 1, wherein a top electrode is mounted on the diaphragm and a bottom electrode is mounted on the substrate.

6. The capacitive MEMS microphone according to claim 5, wherein the bias voltage for the capacitive MEMS microphone is 1-300V.

7. An electronic apparatus, comprising a capacitive MEMS microphone according to claim 1.

8. An electronic apparatus, comprising a capacitive MEMS microphone according to claim 2.

* * * * *